United States Patent [19]

Suwa

[11] Patent Number: 4,650,983
[45] Date of Patent: Mar. 17, 1987

[54] FOCUSING APPARATUS FOR PROJECTION OPTICAL SYSTEM

[75] Inventor: Kyoichi Suwa, Kanagawa, Japan

[73] Assignee: Nippon Kogaku K. K., Tokyo, Japan

[21] Appl. No.: 667,890

[22] Filed: Nov. 2, 1984

[30] Foreign Application Priority Data

Nov. 7, 1983 [JP] Japan .................. 58-208867
Feb. 13, 1984 [JP] Japan .................. 59-24898

[51] Int. Cl.$^4$ ............................... G01J 1/36
[52] U.S. Cl. ........................... 250/204; 250/205
[58] Field of Search ............... 250/205, 204, 226

[56] References Cited

U.S. PATENT DOCUMENTS 2,493,558 1/1950 Thompson .
3,945,731 3/1976 Graser, Jr. .................. 250/205

FOREIGN PATENT DOCUMENTS 42205 4/1981 Japan .

Primary Examiner—Gene Wan
Attorney, Agent, or Firm—Shapiro and Shapiro

[57] ABSTRACT

A focusing apparatus for projection optical system is provided with a projection optical system and an image-forming optical system. The projection optical system is disposed to project an image of an alignment mark formed on a photo mask or reticle onto a light-reflective substrate and also to reverse-project onto the photo mask the light image of the alignment mark projected on and reflected by the substrate. The image-forming optical system forms an overlap image from the reverse-projected reflected image and the alignment mark on the photo mask.

18 Claims, 31 Drawing Figures

F I G.1
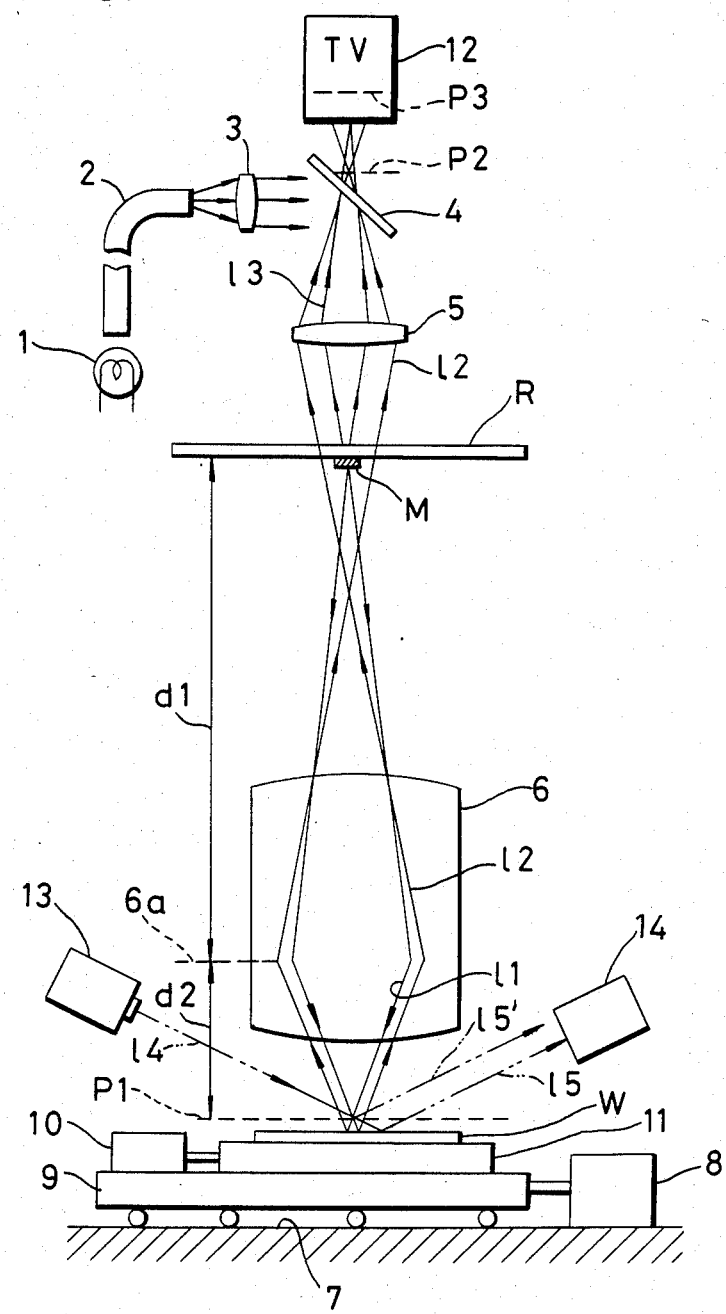

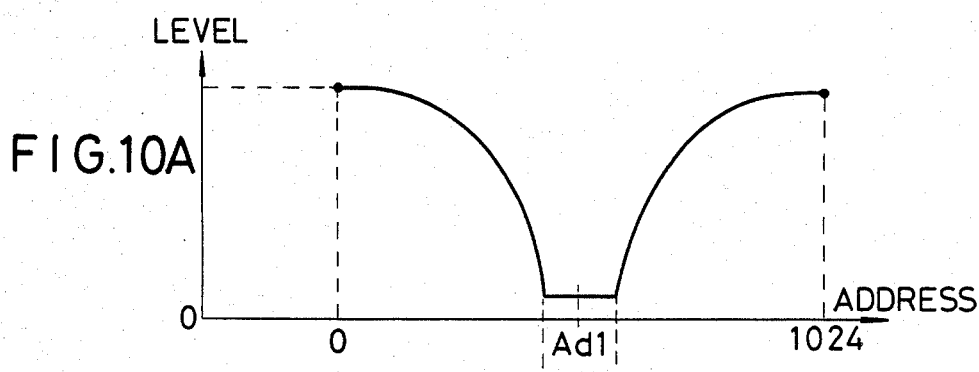
FIG. 10A
FIG. 10B
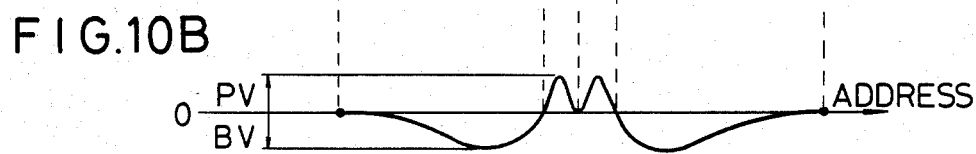
FIG. 11
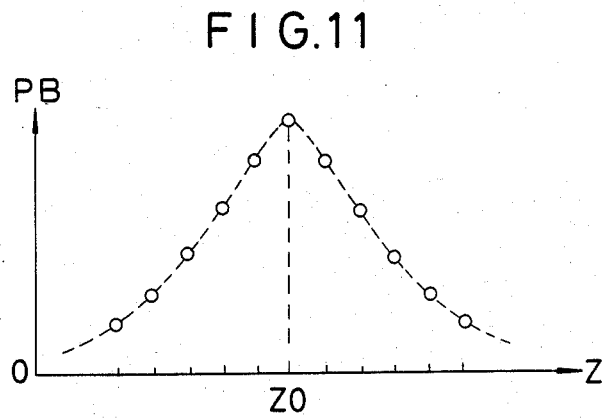
FIG. 12
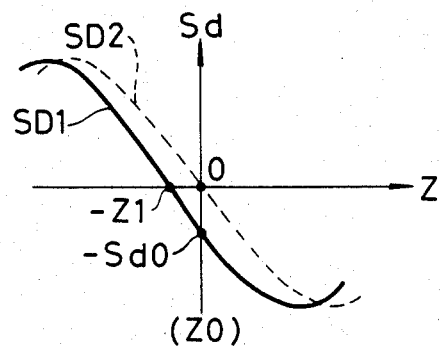

FIG.13A     FIG.13B     FIG.13C
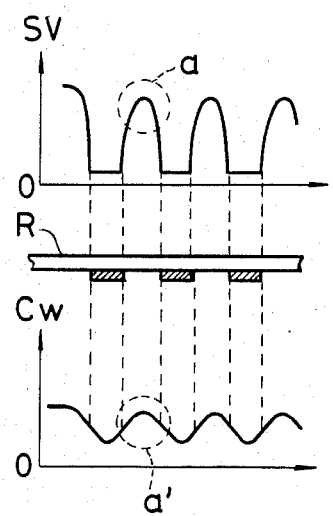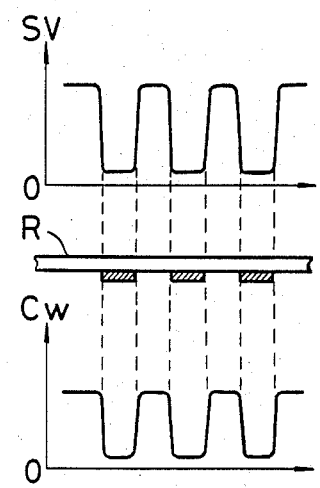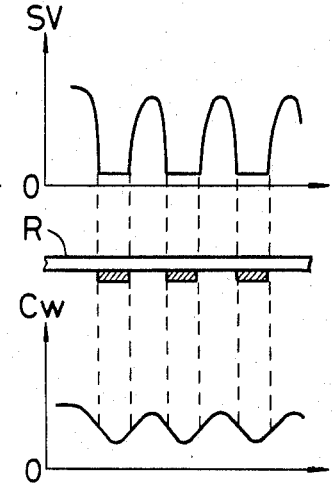
FIG.14     FIG.15
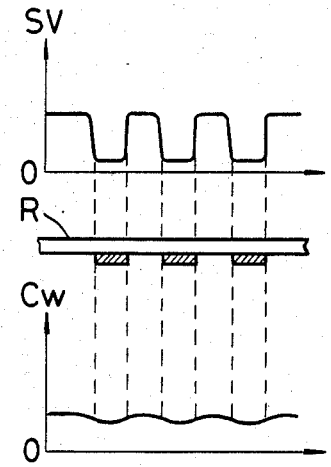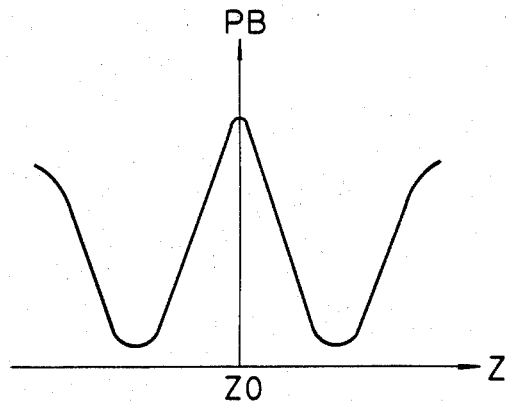

FOCUSING APPARATUS FOR PROJECTION OPTICAL SYSTEM

BACKGROUND OF THE INVENTION

1. Field of the Invention

The present invention relates to apparatus for projecting an image of a pattern formed on a photo mask onto a substrate through a projection optical system. More particularly the present invention relates to an exposure apparatus for use in the optical lithography of semiconductor devices such as IC and VLSI.

2. Description of the Prior Art

Apparatus for optically printing a circuit pattern described on a mask on a wafer by exposure is known and widely used. As a type of the apparatus there has recently been proposed a minifying projection type exposure apparatus generally called stepper. This exposure apparatus is now coming into wide use in the technical field of semiconductor devices.

The stepper uses a projection lens through which an image of a pattern on a mask can be projected on a wafer at a minification of 1/5 or 1/10. The wafer is placed on a stage for two-dimensional movement and exposed to the pattern image. After one exposure the stage is moved a determined distance and then the next exposure is carried out. In this manner, exposure is repeated many times on the wafer while moving the stage at the same and constant pitch after every exposure.

The projection lens used in this type of stepper is required to be bright and have a high resolving power. To satisfy the requirement the lens has a large numerical aperture and a very short depth of focus. The depth of focus is only in the order of several μm although it is variable depending on the type and construction of the lens. Therefore, in projecting the pattern image from the mask onto the wafer it is essential to precisely focus the image on the wafer. To attain the necessary accurate focusing there has been proposed a focus detection apparatus for detecting the position of the wafer surface. An example of such a focus detection apparatus is disclosed in Japanese Patent Application laid open No. 42,205/1981. In this prior art apparatus, an image-forming light beam is obliquely projected on the wafer surface and detection is made for the position at which the reflected beam from the wafer surface is received. The position of the wafer in the direction along the optical axis of the projection lens can be detected by the detection of the reflected beam-receiving position.

To this end, the apparatus is preadjusted in such manner that when the pattern image is correctly focused on the wafer, the reflected beam-receiving position lies just at the origin of a coordinate. Therefore, this type of known detection apparatus needs a very careful adjustment at its manufacture. After the adjustment has exactly been made once, man can focus the pattern image on the wafer simply by moving the wafer up or down in the direction of the optical axis of the projection lens until the beam-receiving point gets in the origin. Thus, man can projects a pattern image always in focus on the wafer.

However, the atmosphere in which the projection optical apparatus is used is variable and the apparatus is sensitive to the change of the atmospheric conditions such as temperature and atmospheric pressure. Although it is very small in amount, the position of focus of the projection lens (the position of the focal plane) shifts in the optical axis direction with the variation of temperature and pressure. This phenomenon is known as focus shift. Due to the focus shift it is difficult to keep the focused relation between the focal plane and the wafer surface. In practice it has been impossible to attain the necessary high accuracy of the alignment (focusing) merely by moving the wafer up or down for alignment with the aid of the oblique incidence type focus detection apparatus according to the prior art. This is an important drawback of the prior art apparatus.

SUMMARY OF THE INVENTION

Accordingly it is the primary object of the present invention to overcome the above-mentioned drawback of the prior art and to provide apparatus which enables to project an image of a pattern on a photo mask or reticle onto a substrate such as wafer at a high accuracy of focusing.

It is another object of the invention to provide a focusing apparatus for the high precision alignment between photo mask and substrate which allows to monitor a mark on the photo mask and a mark on the substrate always in a focused state and which can keep the photo mask and the substrate in a positional relation accurately focused relative to the projection optical system.

To attain the objects, the apparatus according to the present invention is provided with a projection optical system and an image-forming optical system. The projection optical system is disposed to project an image of an alignment mark formed on a photo mask or reticle onto a light-reflective substrate and also to reverse-project onto the photo mask the light image of the alignment mark projected on and reflected by the substrate. The image-forming optical system forms an overlap image from the reverse-projected reflected image and the alignment mark on the photo mask.

In a preferred embodiment of the invention, the overlap image formed by the image-forming optical system is converted into image signal by image sensor means. The image signal is then used to detect the focusing state of the projected mark image on the substrate.

In another preferred embodiment, the image-forming optical system includes means for adjusting the optical system in such manner as to focus the mark image on a determined image plane. The substrate is provided with a fiducial mark thereon. An image of the fiducial mark is projected on the determined image plane through the projection optical system and the adjusted image-forming optical system. In order to accurately focus the fiducial mark image on the determined image plane there is provided means for positioning the substrate in the optical axis direction relative to the projection optical system.

Other and further objects, features and advantages of the invention will appear more fully from the following description taken in connection with the accompanying drawings.

BRIEF DESCRIPTION OF THE DRAWINGS

FIG. 1 schematically shows a first embodiment of the optical exposure apparatus according to the invention;

FIGS. 10A and 10B show the waveforms of image signal and its differentiated signal respectively;

FIG. 11 is a characteristic curve showing the relation between contrast and focus position;

FIG. 12 is a characteristic curve of the detection signal of the phase-synchronizing detector circuit;

FIGS. 13A, B and C and FIG. 14 show waveforms of the image signals in the second embodiment of the invention of which FIG. 13A is of the signal for rear-focus, FIG. 13B for in-focus, FIG. 13C for front-focus and FIG. 14 for far out-of-focus;

FIG. 15 is a characteristic curve showing the relation between contrast and focus position in the second embodiment;

DESCRIPTION OF PREFERRED EMBODIMENTS

Figure 2:
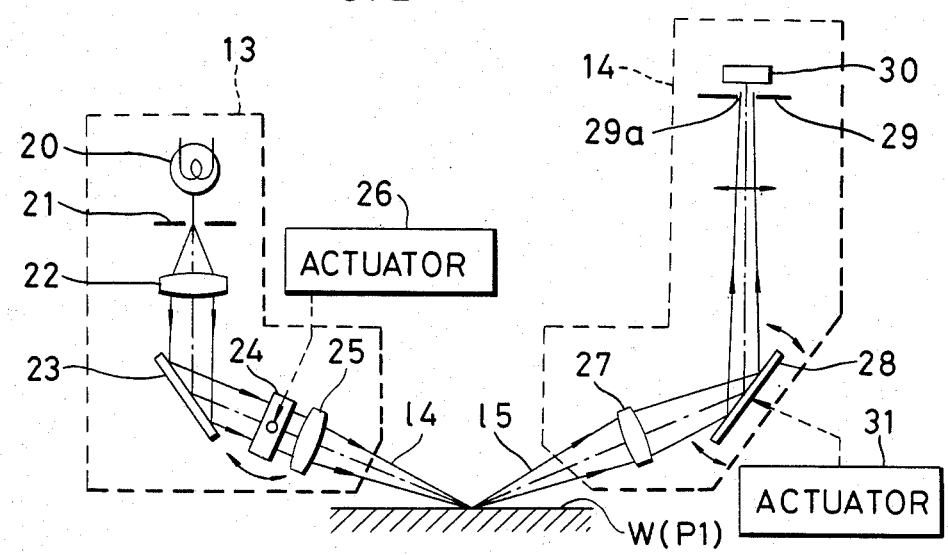
FIG. 2 schematically shows an indirect focus detecting apparatus.

Referring first to FIG. 1 showing a first embodiment of the optical exposure apparatus according to the invention.

In the apparatus, a light source 1 emits rays of light which pass through a bundle of optical fibers 2 and then enter an illumination condenser lens 3. The pencil of rays is shaped into a beam by the lens 3 and then reflected by a half-mirror 4 toward an observation optical system (for example a microscope objective lens) 5. After passing through the observation optical system 5, the beam of light from the light source 1 illuminates a transparent reticle R having a mark M. The mark M is light-absorptive and not light-transmissive. An image of the mark M is projected on a wafer W through a projection lens 6. The projection lens 6 is a lens whose chromatic aberration has been corrected in regard to the exposure wavelength. The term "exposure wavelength" as herein used means the wavelength of the light of the light used in the process of the lithography a circuit pattern on the reticle R onto the wafer W. The above-mentioned mark M is provided on the patterned surface of the reticle R. Therefore, when the pattern surface is positioned at a distance $d_1$ from the pupil $6a$ of the projection lens 6 and the reticle is illuminated by the light of the exposure wavelength, an image of the mark M is formed on an image plane P1 lying at a distance $d_2$ from the pupil $6a$ on the exit side of the projection lens. In order to obviate the variation of the image plane P1 caused by the chromatic aberration, that is, in order to keep the conjugation between the reticle R and the image plane P1, the wavelength of the light from the light source 1 is so predetermined as to be the same as the exposure wavelength.

On a stool 7 there is a XY stage 9 which can be moved two-dimensionally by an actuator 8. Mounted on the XY stage 9 is a Z stage 11 on which a light-reflective wafer W is placed. The Z stage can be moved up and down in the direction along the optical axis of the projection lens 6 by a second actuator 10. The wafer W has a thin layer of photosensitive material coated on the surface.

In the position shown in FIG. 1, the photosensitive surface of the wafer W is a little distant from the image plane P1 in the direction away from the projection lens 6. This positional state is hereinafter referred to as the rear focus state or briefly as rear-focus. The light beam $l_1$ for forming a light image of the mark M enters the projection lens 6 and is focused on the image plane P1 through the lens 6. After focused on the image plane P1, the beam is reflected toward the projection lens 6 by the surface of the coated photosensitive layer or by the surface of the wafer itself. Hereinafter, the surface of the coated photosensitive layer and the surface of the wafer itself will be referred to as the surface of the wafer W collectively.

Transmitted again through the projection lens 6, the reflected light $l_2$ passes through the reticle R at its transparent part around the mark M and enters the light-receiving surface of a television camera or a one- or two-dimensional solid state image sensor 12 through the observation optical system 5 and the half-mirror 4. The light-receiving surface of the television camera 12 is disposed conjugated with the underside surface, i.e., the patterned surface of the reticle R. Therefore, the light image of the mark M observed through the optical system 5 is focused always on the light-receiving surface of the television camera 12 as indicated by a beam $l_3$. Further, since the patterned surface and the image plane P1 are conjugate with each other relative to the projection lens 6, when the image of the mark M is projected on the wafer W using the exposure wavelength of light, the image plane P1 and the light-receiving surface of the television camera 12 are also conjugate with each other. In the rear focus state, therefore, the reflected beam $l_2$ is focused on a plane P2 a little distant from the light-receiving surface of the television camera 12 through the observation optical system 5.

By moving the wafer W upwardly from the position shown in FIG. 1, it is possible to obtain the state in which the surface of the wafer W and the image plane P1 are get in coincidence with each other (the state will hereinafter be referred to as the in-focus state). In this state, the beam $l_1$ and the reflected beam $l_2$ take the same optical path between reticle R and wafer W. Consequently, the reflected beam $l_2$ is focused just on the light-receiving surface of the television camera 12.

If the surface of the wafer W lies at a position nearer to the projection lens 6 than the image plane P1 (this state will hereinafter be referred to as the front focus state), then the optical path of the reflected beam $l_2$ will again deviated from the optical path of the beam $l_1$. Therefore, in such front focus state, the reflected light $l_2$ is focused on an imaginary plane P3 receded from the light-receiving surface of the television camera 12.

The embodiment of exposure apparatus shown in FIG. 1 further comprises a projector 13 and a light receiver 14. The projector projects a beam of light $l_4$ for forming an image of a pin hole or slit. The beam $l_4$ is obliquely directed to the image plane P1 and reflected by the surface of the wafer W as a reflected beam $l_5$. The receiver 14 receives the reflected beam $l_5$ to detect the position of the wafer W in the vertical direction, i.e., in the direction along the optical axis of the projection lens 6. According to the position of the wafer W in the vertical direction, the reflection point of the reflected beam by the wafer surface varies. For example, in the state of in-focus, the beam is reflected as the reflected beam $l_5'$ whereas in the state of rear-focus it is reflected as the reflected beam $l_5$. The light-receiver 14 photoelectrically detects such difference in reflection point. The projector 13 and the light receiver 14 constitute together a focus detection system for detecting the state of focusing of the wafer surface to the image plane P1. A concrete form of the focus detection system is shown in FIG. 2.

Referring to FIG. 2 the projector 13 comprises a light source 20, a slit plate 21, a collimator lens 22, a mirror 23, a plane parallel glass 24 and a focusing lens 25.

The light source 20 emits such wavelength of light to which the photosensitive material coated on the wafer W is not sensitive (for example, infrared rays). The light from the light source 20 illuminates the slit plate 21 which has a slit opening elongated in the direction perpendicular to the plane of the FIG. 2 drawing. The light passed through the slit opening is collimated by the lens 22. The collimated light is reflected to the plane parallel glass 24 by the mirror 23. The plane parallel glass 24 shifts the optical axis of the bundle of collimated rays. The collimated rays exiting from the plane parallel glass 24 are focused by the focusing lens 25 to form an image of the slit of the slit plate 21 on the image plane P1 of the projection lens 6. The plane parallel glass 24 has a rotation axis extending in the direction perpendicular to the plane of the FIG. 2 drawing and can be rotated about the rotation axis within a determined range of rotational angle by an actuator 26. By this rotation of the plane parallel glass the position at which the slit image is formed through the focusing lens 25 is shifted in the direction normal to the image plane P1. In the position shown in FIG. 2, the surface of the wafer W and the image plane P1 are coincident with each other, namely in the state of in-focus.

On the other hand, the light-receiver 14 comprises a lens 27, an oscillating mirror 28, a slit plate 29 and a photo sensor element 30.

The reflected beam $l_5$ mentioned above enters the lens 27 and then impinges on the oscillating mirror 28 which reflects the beam to the slit plate 27 while changing the direction of the reflection by the oscillation of the mirror. The slit plate 29 is disposed at the position at which the beam from the lens 27 is focused. The slit plate has a slit 29a elongated in the direction perpendicular to the plane of the FIG. 2 drawing. The photo sensor element 30 receives the light passed through the slit 29a and generates a photoelectric signal. The oscillating mirror 28 has a rotation axis extending in the direction perpendicular to the plane of the FIG. 2 drawing. An actuator 31 oscillates the mirror 28 about the rotation axis in the manner of simple harmonic motion at a constant angle frequency and with a constant amplitude.

With the arrangement of the focus detection system above shown in FIG. 2, in the state of in-focus, the slit image of the slit plate 21 is once focused on the surface of the wafer W and the slit image formed on the wafer surface W is again focused on the slit plate 29 by the lens 27. The slit image reciprocally moves on the slit plate 29 with the oscillation of the mirror 28. At the time, the center of oscillation of the slit image on the slit plate 29 is coincident with the slit 29a. Therefore, if the wafer surface W is deviated from the image plane P1 of the projection lens 6, the oscillation center of the slit image also deviates from the slit 29a leftward or rightward on the plane of the drawing according to the deviation of the wafer surface. The direction in which the oscillation center is deviated from the slit 29a represents the state of focus, front-focus or rear-focus.

Figure 3:
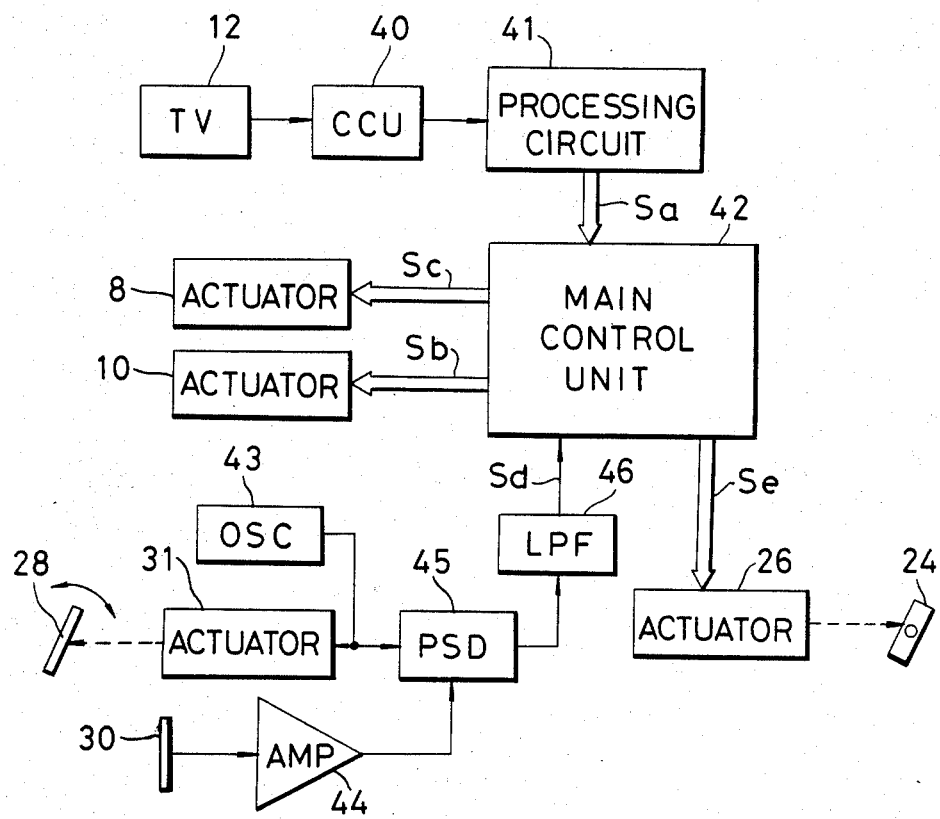
FIG. 3 is a block diagram of the control system.

FIG. 3 shows the control system used in the above embodiment.

From the television camera 12 as previously shown in FIG. 1, an image signal is introduced into a signal processing circuit 41 through a camera control unit (CCU) 40. The processing circuit detects the focusing state of the overlap image on the light-receiving surface of the television camera 12 from the input image signal. As previously described, the overlap image is an image formed by overlapping the light image of the mark M and the reflected image of the mark M from the wafer W one on another. In accordance with the detected state of focusing, the processing circuit 41 generates a detection signal Sa representing the amount by which the Z stage 11 is to be moved. The detection signal Sa is applied to a main control unit 42 which includes a microprocessor (hereinafter referred to as the host MPU).

In accordance with the input detection signal Sa, the main control unit 42 generates driving signals Sb and Sc to bring the focusing state to the best, that is to say, to increase the contrast of the overlap image up to the highest level. The driving signal Sb is applied to the actuator 10 to adjust the position of the wafer in the vertical direction and the driving signal Sc is applied to the actuator 8 of the XY stage 9 to adjust the wafer position two-dimensionally.

Applied to the actuator 31 of the oscillating mirror 28 is an AC signal of a certain frequency from an oscillator 43. In accordance with the frequency of the AC signal, the actuator 31 oscillates the mirror 28 in single harmonic motion. The photoelectric signal from the photo sensor element 30 is amplified by an amplifier 44. The amplified photoelectric signal and the AC signal from the above oscillator 43 are introduced into a phase synchronous detection circuit (PSD) 45 which carries out a synchronous detection on the photoelectric signal using the AC signal as the reference signal. The signal detected by the PSD45 is then sent to a low-pass filter (LPF) 46 to remove the higher harmonic component from the signal. The output signal from LPF46 is applied to the main control unit 42. This output signal, namely, detected signal Sd is a so-called S curve signal. When the oscillation center of the slit image is just at the slit 29a, the signal is zero. When the oscillation center is shifted from the slit 29a, for instance, leftward as viewed on the plane of the FIG. 2 drawing, the signal becomes positive in polarity. When the oscillation center is shifted in the opposite direction, it becomes negative in polarity.

The main control unit 42 also applies to the actuator 26 a driving signal Se for determining the rotation angle of the plane parallel glass 24. By the way it is to be understood that the driving signal Sb is generated in accordance not only with the detection signal Sa but also with the detected signal Sd. The selection of the signal Sa or Sd according to which the driving signal Sb is to be generated, is suitably made by the host MPU in the main control unit 42. In addition to the selection, the host MPU carried out also operations necessary for the generations of the driving signals Sb, Sc, Se and the controls of the output timings of these driving signals thereby totally controlling the sequence of the apparatus as a whole.

Figure 4:
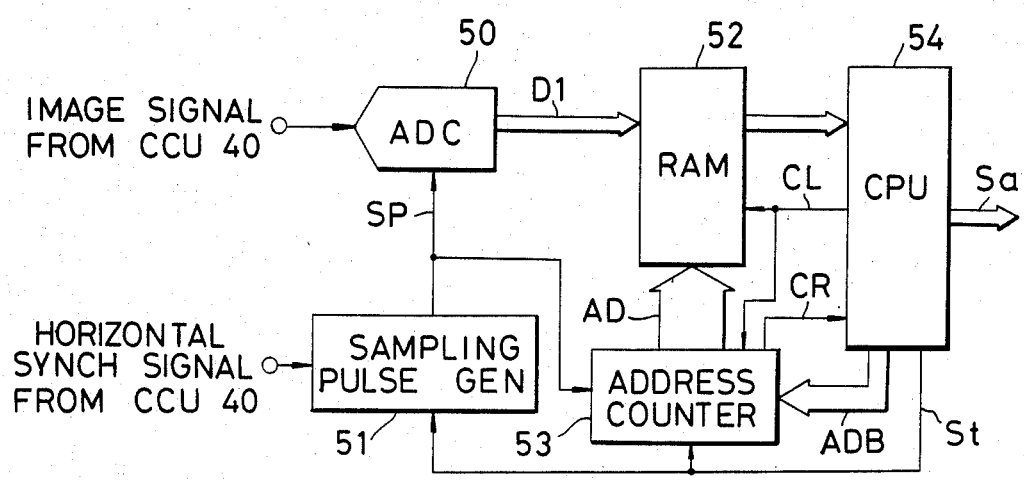
FIG. 4 is a block diagram of the processing circuit shown in FIG. 3.

FIG. 4 shows an embodiment of the signal processing circuit 41.

In the circuit shown in FIG. 4, a high speed analog-digital converter (ADC) 50 receives the image signal from CCU 40 and digitally converts the level of the image signal. A sampling pulse generator 51 receives a horizontal synchronizing signal from CCU 40. In accordance with the input horizontal synchronizing signal, the generator 51 generates, during one horizontal scanning period of the television camera 12, a pulse signal SP composed of pulses corresponding to the respective horizontal picture elements. In response to each pulse of the pulse signal SP, ADC 50 carried out sampling of the image signal and converts the sampled level into a digital value. Digital data D1 are transmitted to a random access memory (RAM) 52 from the ADC 50. The number of pulses of the pulse signal SP is counted by an address counter 53 to generate an address signal AD for the memory RAM 52. Therefore, the RAM 52 serially renews the addresses in response to the pulse signal SP and then stores at the renewed address the data D1 transmitted at each sampling. A micro-computer CPU 54 which is controlled by the host MPU of the main control unit 42, serially reads out the data D1 stored at the respective addresses in RAM52 and detects the state of rising and falling of the level of the image signal, i.e. the contrast of the overlap image. Further, the CPU 54 generates a clear signal CL and a start signal St. The clear signal CL is used to cancel the data stored at the respective addresses of RAM52 and also to reset the content of the address counter 53 to zero or another initial value. The start signal St is used to start the operation of the signal processing circuit 41. This signal St is applied to the sampling pulse generator 51 as well as the address counter 53. The sampling pulse generator 51 generates the pulse signal SP when it receives the horizontal synchronizing signal after the input of the start signal St thereto. The address counter 53 generates the address signal AD in response to the pulse signal SP so long as the counter is receiving the start signal St. When no start signal St is being applied to the counter 53, it generates the address signal AD through an address bus ADB from the CPU54 to allow the CPU 54 to access to the memory RAM 52. The address counter 53 generates also a read-in completion signal CR to the CPU 54 when one scanning of the horizontal scanning line is completed, that is, when the counted number of pulse signals SP reaches a determined value. The signal CR represents the completion of reading-in of the data D1 in the amount of one scanning line. For the sake of simple explanation the following description will be made on the assumption that the number of picture elements per horizontal scanning line of the television camera 12 is 1024, the ADC used is a 8-bit converter (therefore, the data D1 is 8 bits) and the RAM 52 used is a memory having a capacity larger than 1K bite (1024×8 bits). Further, the CPU 54 contains therein a memory or memories for storing the results of operations, various data such constants, programs, etc.

Figure 5:
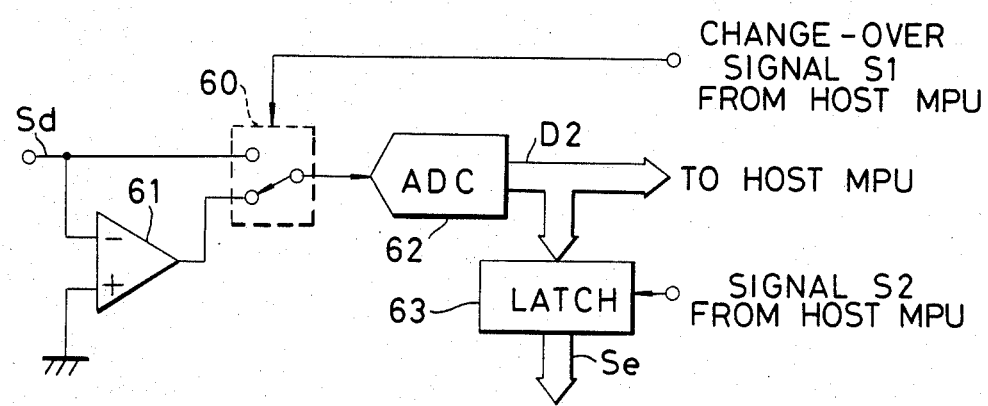
FIG. 5 is a block diagram of a circuit for the calibration of plane parallel glass.

FIG. 5 shows the processing circuit for processing the above-mentioned detected signal Sd. This processing circuit is provided within the main control unit 42.

Referring to FIG. 5, the detected signal Sd is applied to a switch 60. The function of the switch 60 is to carry out a change-over operation in response to a change-over signal S1 from the host MPU in the main control circuit 42. The switch 60 receives also from a differential circuit 61 a difference signal corresponding to the existing deviation of the detected signal Sd from zero level (ground potential). In accordance with the change-over signal S1, the switch 60 applies either the detected signal Sd or its difference signal to an analog-digital converter (ADC) 62. The ADC 62 converts the input signal, i.e, the signal Sd or its difference signal into digital data D2 and sends the data D2 to the host MPU and also to a latch circuit 63. The latch circuit 63 latches the data D2 and the operation of the latch circuit is controlled by a signal S2 from the host MPU. The data D2 emitted through the latch circuit 63 is the above-mentioned driving signal Se. The switch 60 is changed-over by the host MPU in such manner that for the angle calibration of the plane parallel 24 the switch selects the difference signal from the differential circuit 61 and for the detection of the vertical position of the wafer (focus detection) it selects the detected signal Sd.

Figure 9:
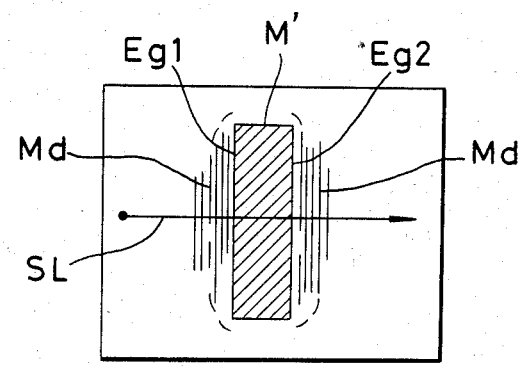
FIG. 9 shows an example of the overlap image.

The manner of operation of the apparatus is as follows:

As shown in FIG. 9, the light image M' of the mark M of the reticle R is in the form of an elongate slit with the long side edges Eg1 and Eg2 extending in the direction intersecting the horizontal scanning line SL of the television camera 12 at right angles. It is not always necessary that the edges Eg1, Eg2 and the scanning line SL intersect at right angles. However, for convenience' sake to explanation, we assume that the edges and the scanning line intersect at right angles as shown in FIG. 9.

Since the observation optical system 5 focuses the light image M' of the mark M on the light-receiving surface of the television camera 12, under the state of in-focus the edges Eg1, Eg2 can be image-picked up with very good contrast whereas the reflected image of the mark M reverse-projected through the wafer W is in a defocused state at the position of the reticle. Consequently, on the light-receiving surface of the television camera 12, the reflected image and the light image M' do not exactly overlap each other. The reflected image appears as a low contrast image Md blurred out around the edges Eg1 and Eg2. Since as previously noted, the mark is not light-transmissive, the reflected image Md appearing around the light image M' looks darkish and the light image M' itself is also looks black. In contrast, other part than the light image M' and the reflected image Md on the scanning line SL looks whitish because of the illumination light reflected by the wafer W. This means that the degree of the contrast around the edges Eg1, Eg2 of the light image M' can be used as a measure of the focusing state. When the reflected image Md and the light image M' are coincident with each other exactly in position, the contrast becomes high, which indicates the state of in-focus. Thus, the focusing state can be detected by detecting the contrast around the edges Eg1, Eg2 of the light image M'.

Figure 6:
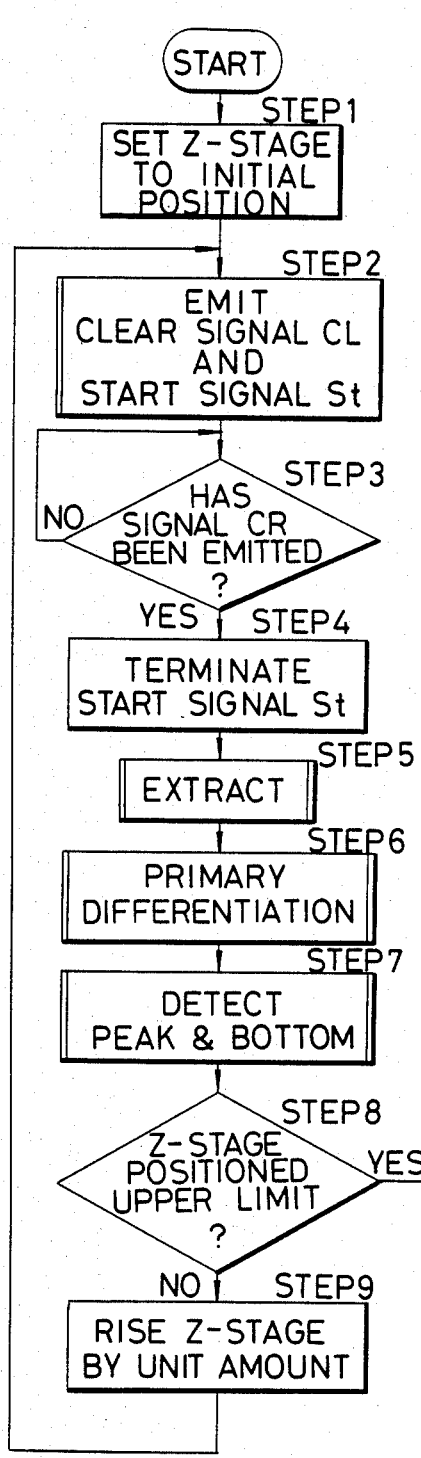
FIG. 6 is a flow chart showing the steps of the alignment operation for the wafer surface and the focal plane of the projection lens.

FIG. 6 is a flow chart of the program for the alignment (focusing) between the surface of the wafer W and the image plane P1 of the projection lens 6. The respective steps of the program will hereinafter be described with reference to FIG. 6.

Step 1

At first the Z stage 11 is set to its initial position. In this embodiment, the initial position is most lowered position of the wafer W as shown in FIG. 1. The Z stage is driven in accordance with the driving signal Sb from the main control unit.

Step 2

Figure 8:
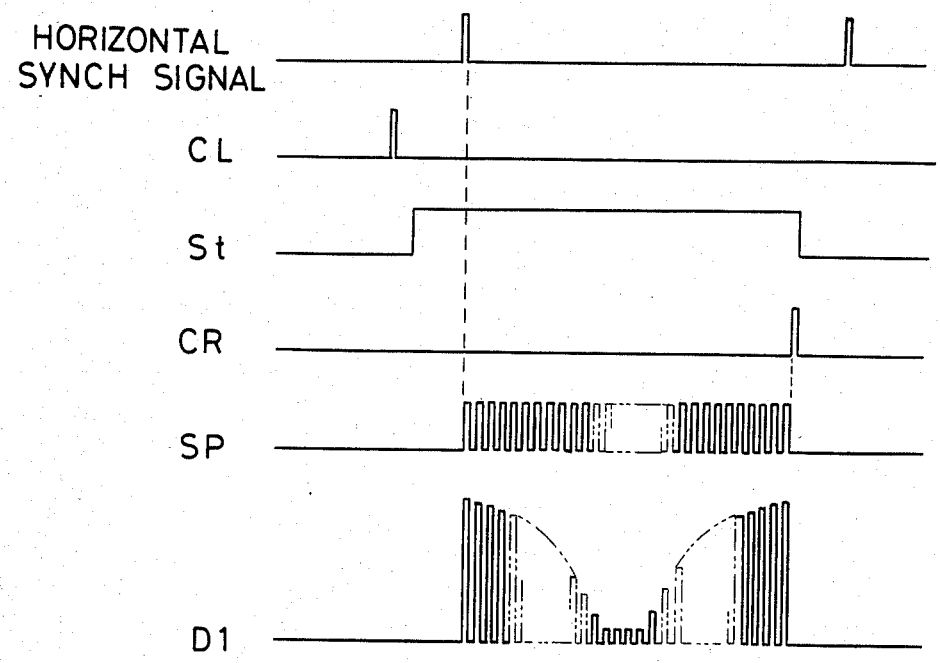
FIG. 8 is a timing chart of the circuit shown in FIG. 4.

The host MPU sends a start instruction to CPU 54 which then emits a clear signal CL in response to the instruction. Thereby the memory RAM 52 and the address counter 53 are cleared. Now the address 0 of RAM 52 is accessible. Further, the CPU 54 emits a start signal St. Thereafter, the input of horizontal synchronizing signal SH is started. From the time point of the input a pulse signal SP is generated. In response to the pulses of the pulse signal, the image signals coming from the CCU 40 are serially sampled and converted into digital data D1. The data D1 are serially stored at the respective addresses of RAM 52 starting from the address of 0. As seen from the histgram in FIG. 8, the data group stored in RAM 52 describes a level curve gently ascending because the level becomes the lowest at the portion of the light image M' and there exists a blurred reflected image Md (low contrast) on the both sides of the light image M'.

Steps 3 and 4

When the address counter 53 has counted all of 1024 pulses of the pulse signal at the end of one horizontal scanning period, the address counter emits a completion signal CR which is monitored by the CPU 54. At the generation of the signal CR, the CPU 54 terminates the generation of the start signal St. In this manner, the image signal generated during one horizontal scanning period is divided into 1024 picture elements. The respective illuminance levels of these picture elements are converted into the corresponding digital values and the digital data are stored in the RAM 52 at the corresponding addresses from 0 to 1024.

Step 5

Among the data group stored in RAM 52, the CPU selects a series of data corresponding to the edge portions Eg1, Eg2 of the light image M' and extracts the rising and falling portions of the time-series image signal. More concretely, data stored at the addresses from 0 to 1024 of RAM 32 are checked to detect the address Ado corresponding to the edge Eg1 and the address Ad2 corresponding to the edge Eg2 thereby finding out the address Ad1 at the middle between Ado and Ad2 as shown in FIG. 10A. The portion of from address 0 to Ad1 is regarded as the falling section of the image signal and the portion of from Ad1 to 1024 as the rising section.

Step 6

Regarding the falling section and the rising section the CPU primary-differentiates the data series in the memory RAM 52. This primary differentiation may be carried out at high speed, for example, by passing the data series through a numerical filter. Concretely speaking, as shown in FIG. 10B, the data of the differentiation waveform are stored at addresses of RAM 52 other than the addresses 0 to 1024. Although the envelope of the waveform is shown in FIG. 10B, it is to be understood that in practice the data series is a series of data dispersed as the data D1 in FIG. 8.

Step 7

The CPU detects the peak value Pv and the bottom (lowest) value Bv on the differentiated waveform of the falling section and calculates the absolute value of the difference between the peak value and the bottom value, $PB = |Pv - Bv|$. The same operation is carried out also on the rising section. The value PB thus obtained is stored in the memory of the CPU. The steeper the rising or falling of the image signal is, the larger the PB value becomes. Therefore, when the image signal rises up and falls down very gently as in the case shown in FIG. 10, the value of PB is small.

Steps 8 and 9

The CPU checks the position of the Z state 11 as to whether it has been elevated up to the limit end (upper limit). If not, then the CPU gives to the host MPU of the main control unit 42 a data for rising the Z stage by a certain unit amount, for example, 0.1 μm. Thereby the actuator 10 operates to rise the Z stage by 0.1 μm.

The above operation is repeated starting from the step 2 until the Z stage reaches the upper limit. Thus, the detection of peak and bottom values is carried after the elevation of the Z stage by 0.1 μm every time. The found value of PB as well as the elevated position of the Z stage are stored in the memory every time.

Step 10

If it is detected at the step 8 that the Z stage has just reached the upper limit, then there is obtained in the memory of the CPU such data as shown in FIG. 11. In FIG. 11, the abscissa represents the positions of the Z stage in the vertical direction at every elevation by 0.1 μm and the ordinate represents the PB values found at the respective positions of the Z stage. From the data the CPU detects the position Zo at which the value of PB is the maximum.

Step 11

After detecting the position Zo at the above step, the CPU sends to the main control unit 42 a signal for positioning the Z stage at the position Zo. This signal is the detection signal Sa. In response to the signal Sa, the main control unit 42 generates a driving signal Sb to lower the stage 11 to the position Zo at which the alignment of the wafer surface with the image plane P1 is attained. As will be understood from the above, the position Zo is the position at which the rising and falling of the image signal is the steepest which means that the light image M' and the reflected image Md get in coincidence with each other exactly (in the state of in-focus).

Figure 7:
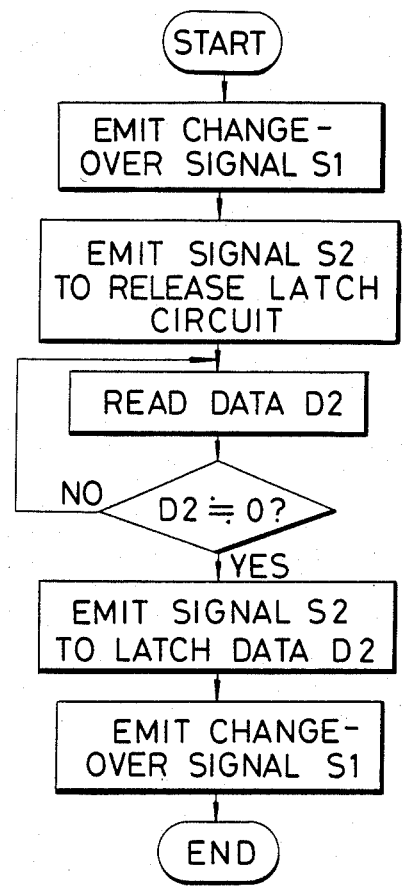
FIG. 7 is a flow chart showing the steps of the operation for the calbration of the indirect focus detecting apparatus.

In the manner described above, the alignment of the wafer surface W with the image plane P1 is attained. In this position, the projected image of the mark M can be focused the best on the wafer surface. After completing the adjustment of the position of the Z stage in the above manner, the operation for the calbration of the focus detection system comprising the projector 13 and the light receiver 14 is carried out in accordance with the flow chart shown in FIG. 7. The operation is as follows:

The host MPU of the main control unit 42 emits a changeover signal S1 to make the switch 60 select the difference signal generated from the differential circuit 61. Subsequent to it the host MPU emits a signal S2 to cancel the latching operation of the latch circuit 63. Thereby, in accordance with the difference signal the plane parallel 24 rotates in a manner of feedback control. When the difference signal becomes zero, the plane parallel 24 stops rotating. FIG. 12 illustrates this phase of operation. In FIG. 12, the abscissa represent the positions of the wafer in the vertical direction (Z-direction) and the ordinate the magnitude (level) of the detected signal Sd. Assuming that it is immediately after the releasing of latch now and the detected signal Sd has a characteristic curve as represented by SD1, the level of the detected signal Sd is −Sdo at the time. However, as previously described, the wafer surface W and the image point P1 must really be in the in-focus state at the position Zo. In other words, in the case of characteristic curve SD1, the focus detection is wrongly made as if the position of in-focus were at such a position of the wafer W further lowered from the position Zo by the distance −Z1. In order to correct it, in this case, the differential circuit 61 generates a difference signal corresponding to the level −Sdo to change the angle of the plane parallel 24 accordingly. Thereby, the level −Sdo is reduced and the characteristic curve SD1 is corrected to the characteristic curve SD2. According to the corrected characteristic curve SD2, as seen in FIG. 12, the level becomes correctly zero at the position Zo.

The host MPU reads the data D2 from ADC 62 and detects the time point at which the data D2 has just become zero, that is to say, the time point at which the difference signal of the differential circuit 61 has just become zero. However, there may be such case where the noise component of the PSD 45 can not completely filtered off by the LPF 46. In such case, the data D2 can not always become zero perfectly. Taking into account such case, the host MPU detects in practice it whether the data D2 has been within a certain range of levels including zero. When the data D2 is zero or approximately zero, it means that the characteristic curve SD1 is completely corrected to SD2.

Subsequently to the above step, the host MPU emits a signal S2 to latch the data D2 by the latch circuit 63 which continues to latch the data until the next input of signal S2. During the time, the actuator 26 of the plane parallel 24 continues to maintain the set angle of the plane parallel using, as the reference value, the driving signal Se based on the latched data. Then, the host MPU generates the changeover signal S1 to select the detected signal Sd.

In this manner, the calibration of the focus detection system shown in FIG. 2 is completed. Now, the exposure of the reticle pattern on the wafer by projection can be started. At the start of exposure, the host MPU reads the data D2 of the detected signal Sd and generates a driving signal Sb for reducing it to zero thereby positioning the wafer at the correct position for in-focus in the vertical direction.

While the first embodiment has been described and shown to be provided with an oblique incidence type focus detection system, it is naturally possible to use other type of detection system, for example, an air micrometer type focus detection system. This system detects the position of wafer in Z-direction by blowing air toward the wafer through a small nozzle orifice and detecting the back pressure. Even using such type of detection system, the same effect of the invention as the first embodiment has can be obtained without any problem.

A second embodiment of the invention will be described hereinafter with reference to FIGS. 13, 14 and 15.

In the second embodiment, there is used, as the mark M on a reticle R, a lattice pattern comprising plural lines arranged parallel at regular intervals. Therefore, the mark has the so-called line-and-space forming periodical structure.

In FIGS. 13A, 13B and 13C a reticle provided with such a lattice mark is shown in a sectional view taken along the direction of scanning line, together with the waveform of an image signal Sv and the light intensity distribution curve Cw on the wafer corresponding to the scanning line from which the image signal Sv was obtained. Of three figures FIG. 13A is for the state of rear focus as shown in FIG. 1, FIG. 13B for the state of in-focus and FIG. 13C for the state of front focus.

In the manner as previously described, an illumination light is projected on a wafer through the reticle R. The light passed through the lattice mark is reflected by the wafer and the reflected light again passes through the lattice mark. At the time there is obtained an image signal of the mark containing the information of contrast around the edges of the mark. This is the image signal Sv.

Referring to FIG. 13A showing the image signal Sv for the state of rear focus, the rising and falling of the signal are both slack and not sharp. In the state of in-focus, as shown in FIG. 13B, the mark image projected on the wafer has the best contrast and the overlap image also has the best contrast. The image signal Sv and the intensity distribution Cw obtained in the state of front focus shown in FIG. 13C are similar to those shown in FIG. 13A (rear focus).

In the above-shown three states, at every light-transmissive portion of the mark, the waveform of the peak portion a of the image signal Sv is analogous to the waveform of the peak portion a′ of the intensity distribution Cw. But, because the image being observed is the reticle mark image reflected from the wafer, the slackness (the degree of blur) of the peak portion a of the image signal Sv is two times larger than the slackness of the peak portion a′ of the intensity distribution Cw.

FIG. 14 shows the image signal and the intensity distribution for extremely out-of-focus (frontwardly or rearwardly). In this case, the intensity distribution Cw becomes substantially uniform and flattened with no peak. The light passed through the lattice mark is considered to uniformly illuminate the wafer W. But, the size of the intensity distribution Cw is smaller than the size of the peak portion of the intensity distribution in FIG. 13B. Because of it, the image signal Sv rises up and falls down steeply as if it were the image signal for the state of in-focus. But, the size of its peak portion is far smaller than that of the image signal for the real in-focus state.

In the same manner as in the previous first embodiment, the rising and falling sections of the image signal Sv are detected to obtain a characteristic curve as shown in FIG. 15. In FIG. 15, the positions of the wafer in Z-direction are on the abscissa and PB values (contrast values) are on the ordinate. The in-focus point lies at Zo. The value of PB decreases gradually with increasing the distance from the position Zo at first and then increases again gradually with further increasing the distance from Zo. By adjusting the position of the wafer surface to Zo at which PB has the maximum value, therefore, the aimed in-focus state can be obtained. If necessary, the waveform shown in FIG. 15 may be further differentiated (secondary differentiation) to obtain the maximum.

The second embodiment using a lattice pattern mark described above brings forth the following advantages and merits.

As the mark is consisted of non-transmissive lines arranged in the scanning direction, the image signal rises up and falls down a plural number of times during one horizontal scanning period. Therefore, many rise- and fall sections can be extracted from the image signal and the contrast detection can be repeated many times for one image signal. This has an effect to minimize errors caused by the noise in the image signal. Also, the detection accuracy can be improved greatly by the repeating detection. Since the image signal obtained by using the lattice pattern mark has a continuous and periodic waveform, it is also possible to find out the position for in-focus according to the detection method using Fourier transformation by detecting the highest order up to which the high frequency component of the waveform is present.

While in the above embodiments the mark M has been shown to be light-absorptive, it is not always necessary for the mark to be light-absorptive. For example, if there is used the projection lens 6 having such structure which is non-telecentric on the reticle side and telecentric on the wafer side, then a light-reflective mark formed of a thin film of metal such as chromium can be used. Even for such projection which is telecentric on both of the reticle side and wafer side, there may be also used a reflective mark provided that a polarized light is used to illuminate the mark M and that the projection lens and the observation optical system are given a characteristic of polarization.

With the embodiments described above it is possible to realize precise and automatic focusing of the projection optical system relative to the substrate surface.

A third embodiment of the invention will hereinafter be described with reference to FIGS. 16 through 28. In this embodiment, in order to attain high accuracy of alignment between reticle or photo mask and substrate, there are provided alignment marks on the reticle and the substrate respectively. Both of the alignment mark on the reticle and the alignment mark on the substrate are observed in a in-focus state. The method of automatic focusing to the substrate used in this embodiment is the same in principle as that previously shown and described in connection with the first and second embodiments.

Figure 16:
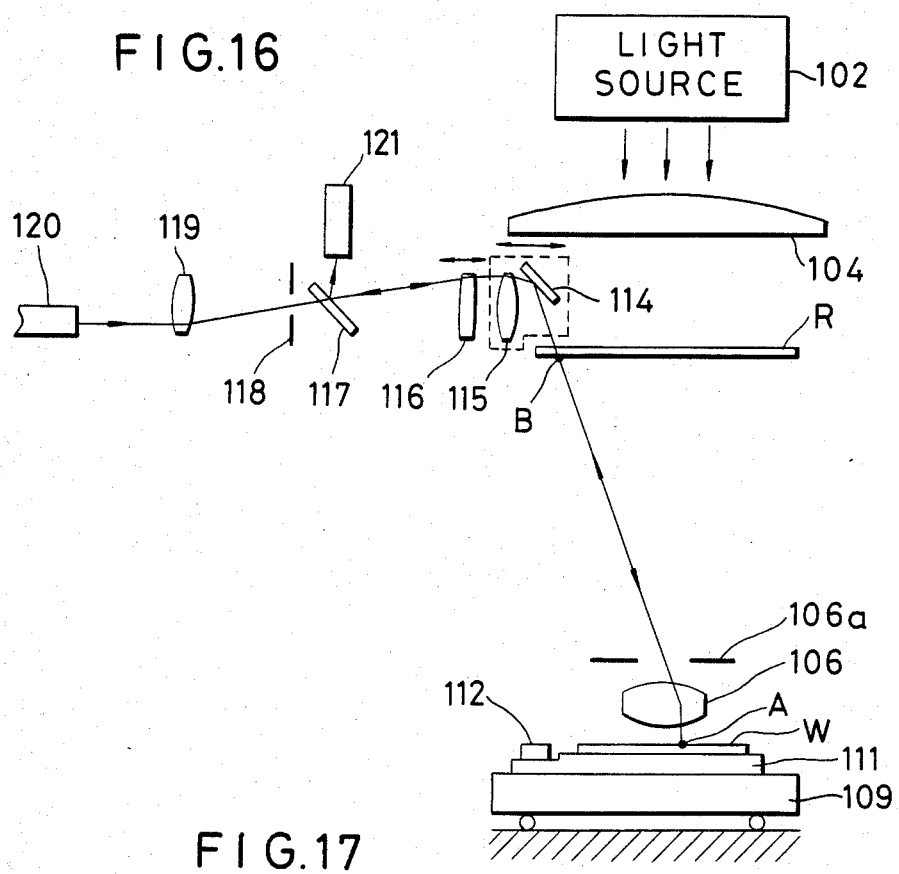
FIG. 16 schematically shows a third embodiment of the optical exposure apparatus according to the invention.

Referring to FIG. 16 a light source 102 emits a beam of light effective to expose a photo resist layer coated on the wafer W. The exposure light from the light source 102 illuminates the reticle R through a main condenser lens 104. Also, through the main condenser lens 104 an image of the light source is formed in the entrance pupil 106a of a projection lens 106.

A denotes the alignment mark provided on the wafer and B the alignment mark provided on the patterned surface of the reticle at a peripheral portion thereof. According to this embodiment, an alignment optical system is used for the above exposure optical system to observe and monitor the positioned relation between the alignment marks A and B. As the illumination for the alignment optical system there is used the same wavelength light as the exposure light. The construction of the alignment optical system is as follows:

Arranged above the periphery of the reticle are a reflection mirror 114, and a first and second objective lenses 115 and 116. The optical axis of the lens 115 is bent right angles by the mirror 114 and intersects the patterned surface of the reticle at right angles. Therefore, the optical axis of the lens 115 is substantially parallel to the optical axis of the projection lens 106. The front focal point of the lens 115 lies on the patterned surface of the reticle. The lens 115 and the reflection mirror 114 are movable together along the optical axis while maintaining the above positional relation. Further, the two lenses 115 and 116 are always collimated therebetween. A diaphragm 118 is disposed at the rear focal point of the lens 116. The diaphragm 118 and the patterned surface of the reticle are conjugate with each other relative to the two lenses 115, 116 and also conjugate with the wafer surface relative to the projection lens 6. Disposed behind the diaphragm 118 is a condenser 119 whose focal point is at the diaphragm. The condenser lens 119 is on the same axis as the optical axis of the first and second objective lenses. A light guide 120 supplies a beam of light of the same wavelength as that of the exposure light beam. The exit surface of the light guide 120 is so disposed as to deflect the center of the surface from the optical axis. A beam splitter 117 is disposed between the diaphragm 118 and the second objective lens 116. In the optical path split by the beam splitter there is an image pickup apparatus 121 such as television camera whose image pickup surface is, like the diaphragm 118, conjugate with the patterned surface of the reticle relative to the two lenses 115, 116 and also conjugate with the wafer surface.

With the above arrangement, the beam from the light guide 120 is supplied to the alignment mark A on the wafer and also to the alignment mark B on the reticle and both of the images of the alignment marks A and B can be monitored by the image pickup apparatus 121. In FIG. 16 the principal ray running from the light guide 120 to the image pickup apparatus 121 passing through the alignment marks A and B is indicated by a solid line with arrows. The second objective lens 116 is mounted movable in the direction of optical axis to correctly focus the image of the alignment mark B on the image pickup surface of the image pickup apparatus 121.

Although only one set of the alignment optical system is shown in FIG. 16, it is to be understood that another set of the same alignment optical system is arranged in the direction perpendicular to the plane of the drawing of FIG. 16. The second alignment optical system cooperates with the above-shown first alignment optical system to detect any two-dimensional deviation of position between reticle and wafer.

Again the stage 109 is two-dimensionally movable and the wafer holder 111 on the stage is movable in the direction along the optical axis (Z-direction). In this embodiment, the wafer holder has a fiducial mark plate 112 fixed thereon. A mark similar to the alignment mark A on the wafer and an additional mark suitable for focus detection other than the alignment mark are provided on the fiducial mark plate. Excepting the mark portions the surface of the fiducial mark plate 112 has a certain reflection factor to light.

Figure 17:
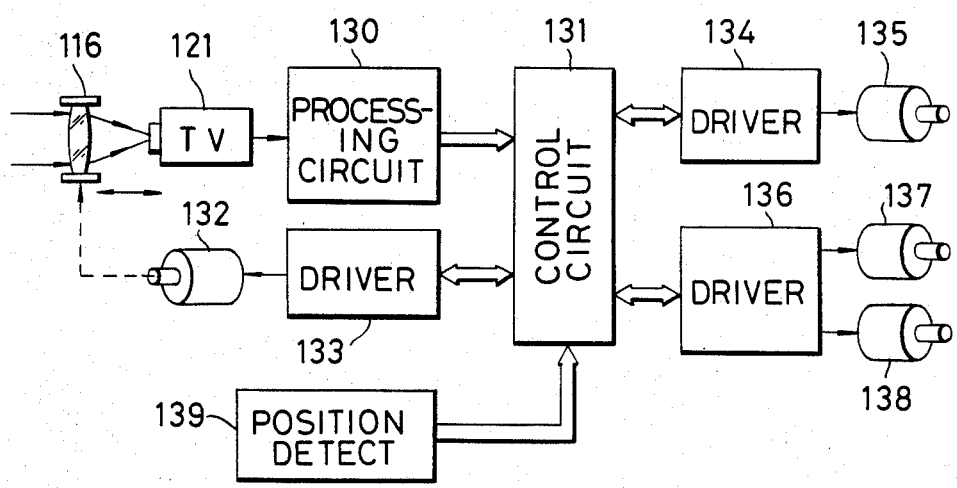
FIG. 17 is a circuit diagram of the control system thereof.

The bright-and-dark contrast of the image of the alignment mark A or B formed by the second objective lens 116 is photoelectrically converted into an image signal by the image pickup apparatus 121. The image signal is then introduced into a signal processing circuit 130 as shown in FIG. 17. The processing circuit 130 has essentially the same construction as that of the processing circuit 41 previously shown in FIG. 3, and detects the contrast of the image on the image pickup surface and applies to a control circuit 131 detection signals corresponding to the contrast. In accordance with the applied detection signals the control circuit 131 controls motors 132, 135 and 137, 138 through drivers 133, 134 and 136 respectively. The motor 132 drives the lens 116, the motor 135 drives the wafer holder 111 to move in Z-direction a distance determined by the driving signal from the control circuit 131. The motors 137 and 138 move the stage 109 in X- and Y-direction respectively a distance determined by the driving signal from the control circuit 131. The two-dimensional position of the stage 109, i.e., the position of the stage on the given coordinates is continuously detected by a position detector 139 which may be formed using a laser interference measuring instrument or encoder. The detected coordinates-position of the stage is processed by the control circuit 131 to use it for positioning the stage.

Figure 18:
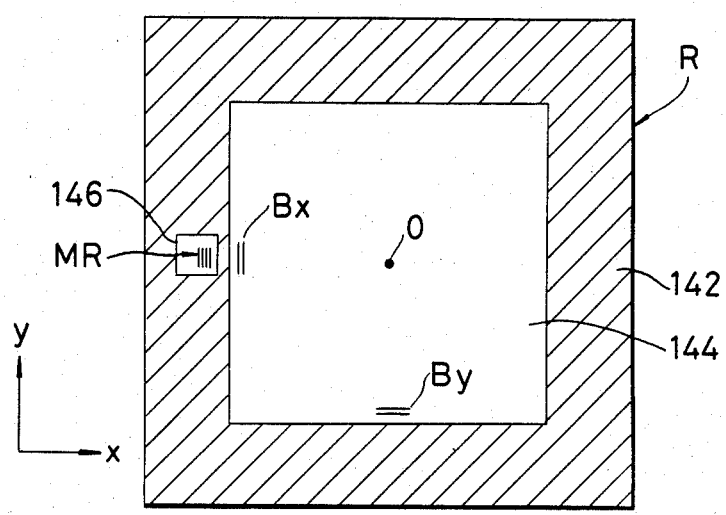
FIG. 18 is a plan view of a reticle.
Figure 19:
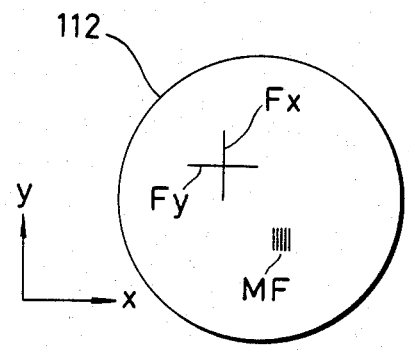
FIG. 19 is a plan view of a fiducial mark plate.

FIG. 18 and FIG. 19 are plan views of the reticle R and the fiducial mark plate 112.

The reticle R is made of a rectangular glass plate having a light-untransmissive area 142 and a pattern area 144. In the pattern area 144 there has been formed a desired circuit pattern. The marginal light-untransmissive area 142 surrounds the pattern area and is formed by vapour-depositing a thin film of metal such as chromium on the glass substrate in the marginal portion. Within the pattern area 144 near the two sides of the area there are alignment marks Bx for alignment in X-direction and By for alignment in Y-direction respectively. These alignment marks Bx, By are observable through the alignment optical system described above.

Within the untransmissive area 142 at a position adjacent to the alignment mark Bx there is provided a transparent window 146 in parallel to the mark Bx. Within the window 146 is a focusing mark MR in a pattern of lines extending in Y-direction and arranged at regular intervals in X-direction. The mark MR is so provided as not to cover all the window but to cover only a part thereof. In this embodiment, the mark MR is provided on the right-hand half of the window 146. The width of each pattern line of the mark MR is a value near the resolution limit of the lenses 115, 116. The reticle R is so positioned as to align its center 0 with the optical axis of the projection lens.

The alignment mark Bx and the window 146 can be alternatively observed by the image pickup apparatus 121 by moving the reflection mirror 114 and the lens 115 in the direction of optical axis.

Referring to FIG. 19, the fiducial mark plate 112 has fiducial marks Fy and Fx and further a focus detecting mark MF formed thereon. The fiducial mark Fy is in a form of line extending in X-direction and the fiducial mark Fx extends in Y-direction. The lines Fy and Fx intersect each other to form a cross which is used for the alignment of the stage position and the position of the reticle image projected. The focus detecting mark MF has a form similar to the above-mentioned mark MR on the reticle. The mark MF is composed of lines extending in Y-direction and arranged at regular intervals in X-direction. Again, each the pattern line of the mark MF has a width near the resolution limit determined by the projection lens and the first and second objective lenses 115 and 116. An image MF' of the mark MF projected in the window 146 at a certain magnification and the reticle mark MR can be image-picked up by the image pickup apparatus 121 at the same time. To this end, the fiducial mark plate 112 is two-dimensionally moved together with the stage and the mark MF is positioned in the position at which an image of the window 146 is to be projected. The width of each the linear pattern of the mark MF is preselected according to the projection magnification. For example, the line width may be 1.0 $\mu$m for the apparatus in which the line width of the mark MR is near the resolution limit of the alignment optical system, for instance, 5 $\mu$m, the magnification of the projection lens is 1/5 and the resolution limit thereof is 1.0 $\mu$m. Preferably, as the line width of the mark MF, a possible smallest value should be selected under the given conditions by the resolving powers of the alignment optical system and projection lens and by the magnification of the projection lens. This is applicable also to the case where not the black lines of the mark MF but the white slit-like spaces between the black lines are considered as linear patterns constituting the mark MF.

Figure 20:
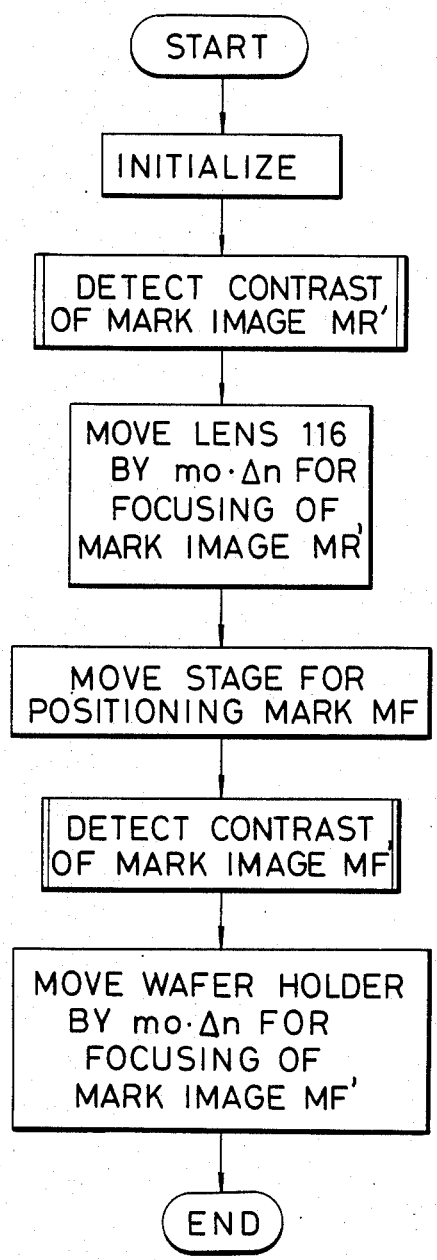
FIGS. 20 and 21 are flow charts showing the sequence of the operation of the third embodiment.

The manner of operation of the embodiment will be described hereinafter with reference to FIGS. 20 and 21 of which FIG. 20 is a flow chart for focusing operation and FIG. 21 for contrast detecting operation.

Figure 22:
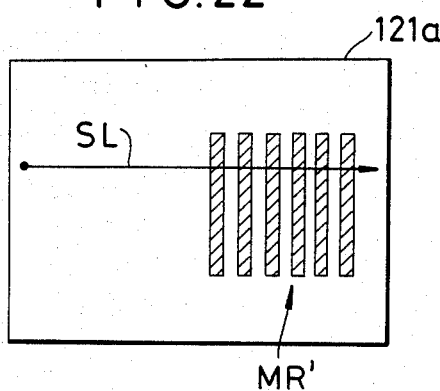
FIG. 22 is a view showing the image pickup surface for displaying the reticle mark.
Figure 23:
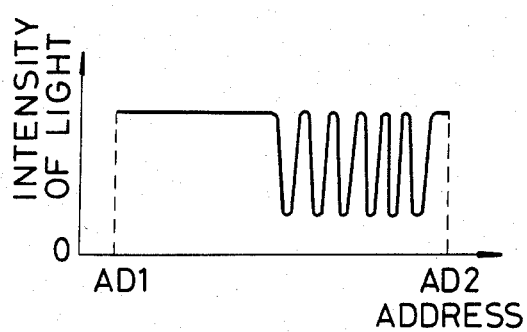
FIG. 23 shows the waveform of the image signal obtained from the image pickup surface.

At first the reticle R is positioned in the position shown in FIG. 16 and then the reflection mirror 114 and the first objective lens 115 are together moved to the position in which an image of the window 146 of the reticle can be image-picked up by the image pickup apparatus 121. Further, in accordance with an instruction from the control circuit 131 the stage is moved to the position in which an image of the window 146 can be projected on the fiducial mark plate 112 at a part other than the marks MF, Fx and Fy. The control circuit emits also an instruction to move the wafer holder 111 to the position in which the surface of the fiducial mark plate 112 is greatly deviated from the proper focal plane of the projection lens in Z-direction. The purpose for which the wafer holder 111 is moved to such position is that a blurred image of the reticle mark MR having a light intensity distribution Cw as previously shown in FIG. 14 must be formed on the surface of the fiducial mark plate 112. Since, as previously noted, the surface of the plate 112 is reflective, the blurred image is reflected by the plate and again projected on the reticle through the projection lens. On the reticle, the reflected image of the mark MR becomes much more blurred and its own contrast is extremely low. As a result of it, the reticle mark MR is uniformly illuminated over all the surface. When the mark image of the mark MR is picked up by the image pickup apparatus 121, the mark image appears on the image pickup surface 121a, for example, as a mark image MR' shown in FIG. 22. In FIG. 22, the mark image MR' is on the right-hand half of the image pickup surface 121a as viewed in the horizontal scanning direction and appears in the form of parallel linear black patterns with white spaces between the black lines.

The above operations are carried out at the first step of initialization of the flow chart shown in FIG. 20.

At the next step, the contrast of the mark image MR' is detected. For every picture element on the scanning line SL, the level of the picture signal is converted into a digital value by ADC in the signal processing circuit 130. The digital values are serially stored in RAM keeping the direct correspondency of picture element to address. In the RAM there are formed data informing of the intensity distribution of light on the scanning line and the data are stored in the RAM at addresses AD1 to AD2.

Figure 21:
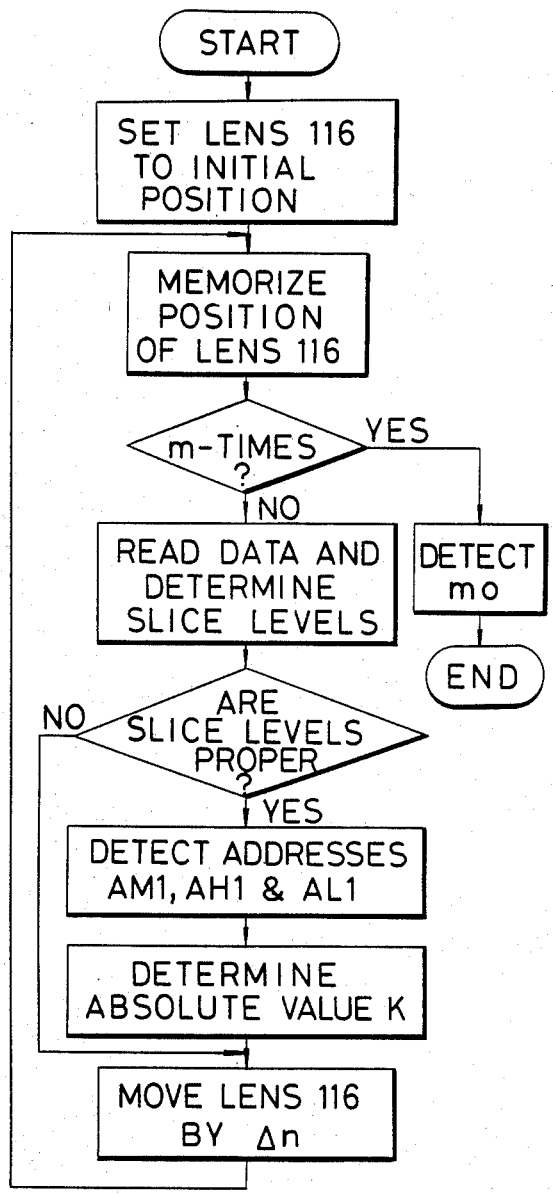

In order to detect the contrast level from the intensity distribution waveform of the photoelectric signal obtained above various methods may be used one example of which is illustrated by the flow chart FIG. 21. In this example, the operational processings necessary for the detection of contrast level are executed by CPU of the signal processing circuit 130.

Referring to FIG. 21, the second objective lens 116 is moved by the motor 132 to set the lens at its initial position, i.e., one end of the lens moving range at first. In this initial position, the lens 116 forms a blurred mark image MR' on the image pickup surface 121a. CPU keeps this position of the lens 116 in memory. Then the lens 116 is moved in the direction of the optical axis stepwisely at a rate of $\Delta n$ per step. CPU continues reading of the intensity distribution data into RAM until the lens 116 has been step-advanced m-times, by $\Delta n$ every time. From the maximum and minimum values in the data, CPU determines three slice levels Vl, Vm and Vh in the manner illustrated in FIG. 24.

Figure 24:
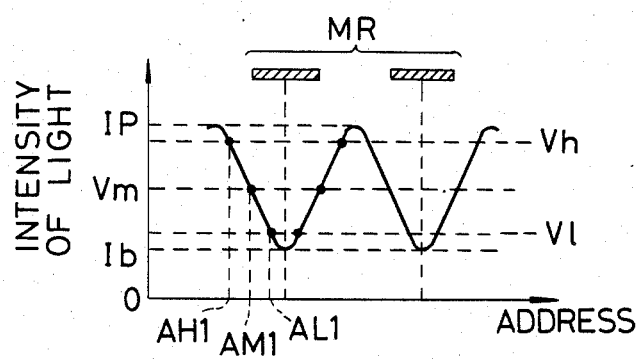
FIG. 24 shows the waveform of the image signal for out-of-focus.

The curve in FIG. 24 is an enlarged waveform of a portion of the intensity distribution of the mark image MR' obtained when the lens 116 is in the initial position. The contrast of the mark image is low. From the data stored in RAM the CPU detects at first the peak (maximum) level Ip and the bottom (minimum) lelevel Ib. Next the CPU calculate the mid-value between the peak level Ip and the bottom level Ib. The found mid-value is the slice level Vm. Further, CPU calculates the slice level Vh which is a certain value larger than Vm and the slice level Vl which is a certain value smaller than Vm. The slice levels Vh and Vl determined in this manner are judged to be proper by CPU only when Vh<Ip and Vl>Ib. After verifying that the slice levels are proper, CPU detects, among the data in RAM, the address AM1 corresponding to the waveform having the same level as the slice level Vm. Thereafter, the CPU detects addresses AH1 and AL1 before and after the address AM1 corresponding to the waveforms having the same levels as the slice levels Vh and Vl respectively.

After detecting the addresses AH1 and AL1, the CPU calculates the absolute difference value K between AH1 and AL1. The found absolute value K and the corresponding position of the lens 116, i.e., the number of advanced steps m are memorized. The intensity distribution curve of the mark image MR' is gentle for low contrast and steep for high constrast. Therefore, the absolute value K becomes smaller with increasing of the contrast of the mark image MR'.

At the next step, the CPU applies to the control circuit 131 an instruction to move the lens 116 by $\Delta n$. The above operation is repeated and the position of the lens 116 is memorized. If the slice levels Vh and/or Vl are not proper, that is, when Vh>Ip and/or Vl<Ib, the calculation of the absolute value K is impossible. Therefore, in this case, the lens 116 is further advanced stepwisely.

Figure 25:
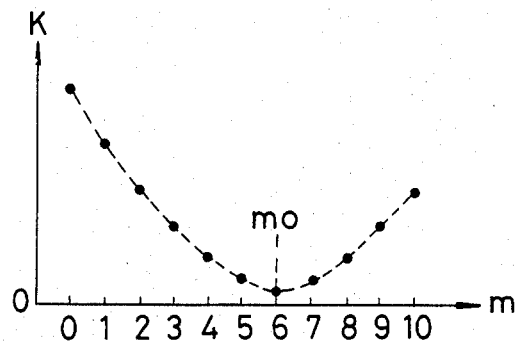
FIG. 25 is a contrast characteristic curve obtained from the image signal.

When the stepwise advancement by $\Delta n$ of the lens 116 has been repeated m times, there are stored in CPU the respective absolute values K corresponding to m times stepwise advancement as shown in FIG. 25. In FIG. 25, mo stands for the number of advanced steps for the minimum value of K, i.e., for the highest contrast of mark image MR'. In the case shown in FIG. 25, mo=6. CPU detects this value (mo).

Figure 26:
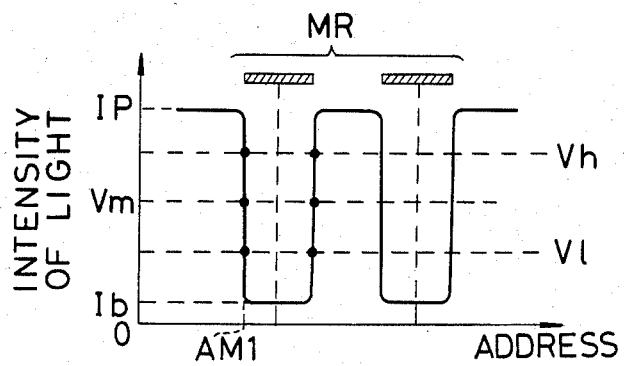
FIG. 26 is a waveform of the image signal for in-focus.

After completing the operation shown in the flow chart of FIG. 21, the CPU sends to the control circuit 131 an instruction to position the lens 116 at mo·$\Delta n$, in case of the shown example, at 6·$\Delta n$. In accordance with the instruction, the control circuit 131 moves the lens 116 to the position of 6·$\Delta n$ from the initial position. In this position, therefore, the mark image MR' can be focused on the image pickup surface with the best contrast. The waveform of the image signal of the mark image MR' is the sharpest at the time as shown in FIG. 26.

Figure 27:
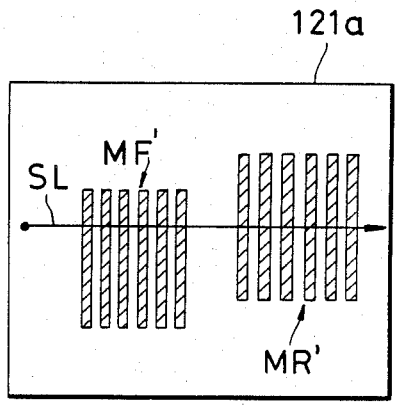
FIG. 27 is a view showing the image pickup surface for displaying the reticle mark and the fiducial mark.
Figure 28:
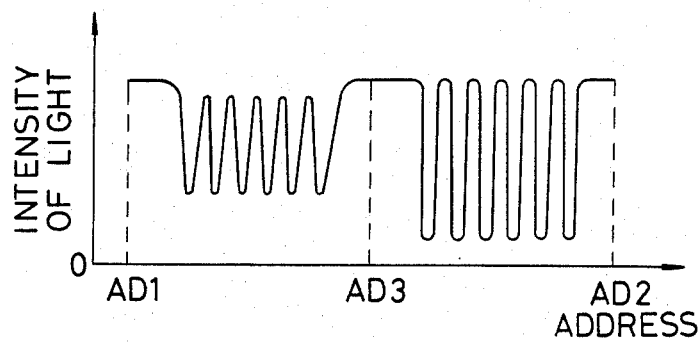
FIG. 28 is a waveform showing an example of the image signal obtainable from the image pickup surface shown in FIG. 27.

When the sharpest image signal is obtained, the first step of focusing operation is completed. Subsequent to it, the control circuit 131 carries out the second step of focusing operation, which is as follows:

The control circuit 131 moves the stage 109 to the position at which the mark MF on the fiducial mark plate 112 can be picked up by the image pickup apparatus 121 through the window 146 of the reticle. Thus, on the image pickup surface, there are formed an image MF' of the mark MF as well as the well-focused mark image MR' at the same time as shown in FIG. 27. On the image pickup surface of the image pickup apparatus, the linear pattern lines of the mark image MF' and the linear pattern lines of the mark image MR' appear in parallel to each other. The light intensity distribution on the scanning line SL as shown in FIG. 27 is read in RAM of the signal processing circuit 130. FIG. 28 shows the waveform of such intensity distribution stored in RAM at the corresponding addresses. In FIG. 28, the portion of the waveform ranging from address AD1 to address AD3 is the data derived from the mark image MF'.

In the same manner as in the previous first step of focusing, the CPU carried out the contrast detection of the mark image MF' in accordance with essentially the same flow chart as previously shown in FIG. 21. But, this time, instead of the lens 116 the wafer holder 111 is moved in Z-direction m times stepwisely at a rate of n per step.

After completing the contrast detection of the mark image MF', the CPU finally sends to the control circuit 131 an instruction to position the wafer holder 111 at a selected position in Z-direction. In this position, the surface of the fiducial mark plate 112 is coincident with the focal plane of the projection lens. Therefore, on the image pickup surface 121a, both of mark image MR' and mark image MF' appear in the best focused state. Thus, the marks MR and MF are observable very clearly and sharply.

Provided that the surface of the fiducial mark plate 112 and the surface of the wafer W are exactly coplanar, both of the alignment mark Bx on the reticle and the alignment mark A on the wafer can be observed in a well-focused state when the alignment marks are being detected through the alignment optical system while moving forwards the reflection mirror 114 and the first objective lens 115 together. This is advantageous in particular for the so-called Die by Die alignment according to TTL (Through The Lens) method. In this system of alignment, the alignment between reticle alignment mark B and wafer alignment mark A is performed through an objection lens. According the above embodiment, the images of the alignment marks B and A are observable in the state of in-focus sharply. Therefore, the detection of disalignment between the two alignment marks can be made with improved accuracy. Thereby, a substantial improvement of accuracy can be attained in alignment between reticle and wafer.

While the invention has been particularly shown and described with reference to preferred embodiments thereof, it will be obvious to those skilled in the art that many modifications and variations are possible in light of the above teachings.

For example, in the third embodiment described above, instead of the mark MR the alignment mark B may be used for signal processings. Further, a linear pattern mark similar to the mark MF may be provided on the wafer. In this case, the alignment for focusing between the patterned surface of wafer and the image plane of projection lens can be carried out using the linear mark on the wafer.

It is not always necessary to observe the marks MR and MF at the same time. It is also possible to detect at first the mark MR and then move the reflection mirror 114 and the lens 115 of the alignment optical system to detect the mark MF from another position on the mask.

If a collimator lens system is interposed in the optical path between the lens 116 and the image pickup apparatus 121, the same effect as obtained by moving the second objective lens 116 for focusing the mark MR (the first step of focusing operation in the third embodiment) will be obtained by adjusting the position of the collimator lens system.

I claim:

1. Apparatus for forming a light image of a photo pattern on a substrate member, said apparatus comprising:
    projection optical means disposed between said photo pattern and said substrate member for forming said light image;
    said substrate member having a light-reflective surface disposed to reflect the image-forming light from said projection optical means, the reflected light being incident upon said projection optical means and then directed to said photo pattern by said projection optical means;
    image-forming optical means for forming another light image of said photo pattern on a determined image plane, said reflected light after passing through said projection optical means and said photo pattern being directed to said another light image on said determined image plane through said image-forming optical means;
    means for positioning said substrate member in response to a distribution of light on said determined image plane so that said photo pattern and said reflective surface are conjugate with each other relative to said projection optical means;
    means for detecting a position of said reflective surface in a direction of an optical axis of said projection optical means to generate a detection signal; and
    means for calibrating said detecting means so that said detection signal is generated when said substrate member is positioned by said positioning means.

2. Apparatus according to claim 1, wherein said photo pattern is composed of a light-transmissive part and a light-nontransmissive part, and said image-forming optical means is disposed on the side opposite to said projection optical means relative to said photo pattern.

3. Apparatus according to claim 1 wherein said photo pattern includes a periodic structure comprising pattern elements arranged at a constant pitch.

4. Apparatus according to claim 1, wherein said positioning means includes means for forming an image signal corresponding to the distribution of light on said determined image plane and means for adjusting a positional relation between said photo pattern light image and said reflective surface in response to said image signal.

5. Apparatus according to claim 4, wherein said photo pattern includes a period structure comprising pattern elements arranged at a constant pitch, and wherein said image signal-forming means includes image-responsive means for scanning said determined image plane in the direction of the period of said another light image of the photo pattern.

6. Apparatus according to claim 1, which further comprises means for supplying the light for illuminating said photo pattern through said image-forming optical means.

7. Apparatus according to claim 1, further comprising another positioning means for moving said substrate member in response to said detecting means calibrated by said calibrating means in the direction of said optical axis until said detection signal is generated.

8. Apparatus according to claim 1, wherein said positioning means generates an output signal when said substrate member is positioned by said positioning means, and said calibrating means is operated in response to said output signal.

9. Apparatus for forming a light image of a photo pattern placed on a first plane on a second plane, said apparatus comprising:
    projection optical means disposed between said first and second planes for forming said light image;
    alignment mark means comprising a first mark provided on said photo pattern and a second mark provided on said second plane, said alignment mark means being used to attain the alignment in relative position between said photo pattern and said second plane;
    image-forming optical means for forming a light image of said first mark on a determined image plane, said image-forming optical means including adjustment means for focusing said light image of the first mark on said determined image plane;
    illumination means having a light source providing an illumination light beam illuminating said first and said second mark through said image-forming optical means and said projection optical means; and
    means for controlling the relative positional relation between said projection optical means and said second plane in a direction of an optical axis of said projection optical means so as to form said light image of the second mark on said determined image plane through said projection optical means and said image-forming optical means adjusted by said adjustment means.

10. Apparatus according to claim 9, wherein said illumination means includes stop means disposed at a position conjugate with said first mark relative to said image forming optical means for determining an illumination field.

11. Apparatus according to claim 9, which further comprises means for forming an image signal corresponding to the distribution of light on said determined image plane.

12. Apparatus according to claim 11, wherein said adjustment means includes means for driving said image-forming optical means for focusing in accordance with said image signal.

13. Apparatus according to claim 11, which further comprises substrate means having said second plane and wherein said control means includes means for driving said substrate means in accordance with said image signal.

14. Apparatus according to claim 9, wherein said photo pattern is composed of a light-transmissive part and a light-nontransmissive part, and said image-forming optical means is disposed on the side opposite to said projection optical means relative to said first plane.

15. Apparatus according to claim 9, wherein the first and second marks include each a periodic structure comprising pattern elements arranged at a constant pitch.

16. Apparatus for forming a light image of a photo pattern placed on a first plane on a second plane, said apparatus comprising:

projection optical means disposed between said first and second planes for forming said light image;

alignment mark means comprising a first mark provided on said photo pattern and a second mark provided on said second plane, said alignment mark means being used to attain the alignment in relative position between said photo pattern and said second plane;

image-forming optical means for forming a light image of said first mark on a determined image plane, said image-forming optical means including adjustment means for focusing said light image of the first mark on said determined image plane; and means for controlling the relative positional relation between said projection optical means and said second plane in a direction of an optical axis of said projection optical means, said controlling means controlling said positional relation so that said photo pattern and said second plane are not conjugate with each other relative to said projection optical means during said focusing by said adjustment means and controlling said positional relation so that said light image of the second mark is formed on said determined image plane through said projection optical means and said image-forming optical means adjusted by said adjustment means.

17. Apparatus according to claim 16 further comprising illumination means for providing an illumination light beam to said first mark and said second mark.

18. Apparatus according to claim 17, wherein said illumination means includes a light source disposed at a position conjugate with said first plane relative to said image-forming optical means.

* * * * *